United States Patent [19]

Albert

[11] Patent Number: 5,109,175

[45] Date of Patent: *Apr. 28, 1992

[54] MONOLITHIC RESONATOR FOR VIBRATING BEAM FORCE SENSORS

[75] Inventor: William C. Albert, Boonton, N.J.

[73] Assignee: Lucas Schaevitz Inc., Pennsauken, N.J.

[*] Notice: The portion of the term of this patent subsequent to Dec. 25, 2007 has been disclaimed.

[21] Appl. No.: 582,103

[22] Filed: Sep. 14, 1990

Related U.S. Application Data

[63] Continuation-in-part of Ser. No. 454,402, Dec. 21, 1989.

[51] Int. Cl.⁵ .............................................. H01L 41/08
[52] U.S. Cl. .................................... 310/321; 310/312; 310/323; 310/329; 73/517 R; 73/517 AV
[58] Field of Search ............... 310/312, 321, 323, 329; 73/517 AV, 517 R, 777, 778, 781, DIG. 1, DIG. 4

[56] References Cited

U.S. PATENT DOCUMENTS

| | | | |
|---|---|---|---|
| 3,470,400 | 12/1967 | Weisbord | 310/329 |
| 3,479,536 | 11/1969 | Norris | 310/323 |
| 4,435,666 | 3/1984 | Fukui et al. | 310/329 |
| 4,445,065 | 4/1984 | Albert | 310/321 |
| 4,538,461 | 9/1985 | Juptner et al. | 310/329 |
| 4,656,383 | 4/1987 | Albert | 310/321 |
| 4,658,174 | 4/1987 | Albert | 310/323 |
| 4,658,175 | 4/1987 | Albert | 310/323 |
| 4,710,668 | 12/1987 | Fima et al. | 310/321 |
| 4,743,790 | 5/1988 | Albert | 310/321 |
| 4,804,875 | 2/1989 | Albert | 310/323 |
| 4,970,903 | 10/1990 | Hanson | 73/DIG. 1 |
| 4,980,598 | 12/1990 | Albert | 310/321 |

Primary Examiner—Mark O. Budd
Assistant Examiner—Thomas M. Dougherty
Attorney, Agent, or Firm—Nixon & Vanderhye

[57] ABSTRACT

A monolithic resonator structure for a vibrating beam force sensor, comprising an accelerometer and pressure transducer, is provided which comprises an outer structure including a mounting structure, a force transfer structure, a plurality of flexure beams extending between the mounting and force transfer structures; and an inner structure including a vibrating beam extending between the mounting structure and the force transfer structure. The monolithic resonator is non-planar in that the outer structure has a thickness greater than said inner structure.

38 Claims, 4 Drawing Sheets

MONOLITHIC RESONATOR FOR VIBRATING BEAM FORCE SENSORS

The present application is a continuation-in-part of U.S. application Ser. No. 07/454,402 entitled "Monolithic Resonator for a Vibrating Beam Accelerometer" filed Dec. 21, 1989.

BACKGROUND OF THE INVENTION

1. Field of the Invention

The present invention relates to a monolithic resonator for use in a vibrating beam force sensors such as a vibrating beam accelerometer (VBA) and a vibrating beam pressure transducer (VBPT) in which the proof mass, the proof mass suspension system or the pressure force suspension system and the resonator are made from a single piece of quartz crystal.

2. Discussion of Prior Art

The sensing element or resonator is a force-sensitive, vibrating beam. The vibrations of the vibrating beam are sustained by the combined interaction of the electrode pattern plated on the beam, the piezoelectric properties of the quartz crystal material and the electrical energy supplied by the electronic oscillator circuit. When the vibrating beam experiences axial tension, its vibration frequency increases and, conversely, when the beam experiences compression, its vibration frequency decreases. The advantages of such a sensing element in an accelerometer application include a direct digital output as well as good stability and low temperature sensitivity due to the properties of quartz crystal. The advantages to be gained by fabricating the structure from a single piece of quartz crystal include low cost, elimination of many assembly operations, elimination of joints, and compact size.

Single piece VBA's or VBPT's, per se, are known in the art, for example, see U.S. Pat. No. 4,804,875 which discloses a monolithic piezoelectric structure in both single and dual vibrating beam configurations. See also, as representative examples, U.S. Pat. Nos. 4,658,174; 4,658,175; 4,656,383; 4,446,394; 4,445,065, 3,479,536 and 3,470,400.

SUMMARY OF THE INVENTION

In one exemplary embodiment in accordance with this invention, the sensing element comprises a vibrating beam, isolator masses and isolator beams generally of the type shown in U.S. Pat. No. 4,743,790, owned by the assignee of this invention, although other resonator designs could be utilized. In accordance with this invention, however, one end of the resonator or sensing element is attached to the mount structure, while the other end is attached to the force transfer structure (proof mass or pressure force), and these two structures are joined together by means of a series of flexure beams. Absent the vibrating beam sensing element, the flexure beams would otherwise permit the mount structure and the proof mass or pressure transmission structure to move relative to each other in a parallel like motion along or in an angular motion about a given axis.

The mount structure and proof mass or pressure transmission structure each include appendages, for mounting the sensing element to an external surface such as an accelerometer or pressure transducer housing, and in the accelerometer embodiment for mounting an additional proof mass to increase the total mass of the device, respectively.

As will be explained in greater detail below, the present invention also incorporates for any resonator device a non-planar design which has many advantages over prior art constructions. For example, typical prior art designs utilize planar construction whereby the thickness of all parts of the structure are equal. This invention utilizes a non-planar approach whereby the outer structure, consisting of the flexure beams and mount structures, may be from three to ten times thicker than the inner structure vibrating beam portion. This arrangement achieves a structure which can withstand Z axis acceleration and vibration, while being sufficiently sensitive to X input axis acceleration.

In addition, structure stiffness along the Z axis is achieved by making the outer structure thickness as great as necessary. If the thickness of the inner structure is increased correspondingly with the thickness of the outer structure, the force sensitivity of the vibrating beam would decrease since the sensitivity of the vibrating beam sensing element is inversely proportional to the Z axis thickness. In the accelerometer application, low vibrating beam sensitivity would mean that a heavier proof mass would be needed which in turn, would place the outer structure under a greater load to Z axis acceleration. Thus, it has been determined that a single thickness structure is not practical because the outer structure Z axis stiffness requirements cannot be conveniently made compatible with the vibrating beam inner structure sensitivity requirements. By adopting a non-planar approach, the outer and inner structure stiffness requirements are no longer related, so that the Z axis stiffness requirements and vibrating beam sensitivity requirements can be conveniently met.

Another advantage of the present invention is the utilization of multiple flexure beams. This arrangement results in an outer structure which is very stiff to Z axis loads but very compliant to X axis loads, as will be explained in greater detail below.

Another feature of the present invention with respect to an accelerometer embodiment is the placement of all flexure beams at the bottom end of the structure. This keeps the center of gravity of the proof mass low on the structure.

Another feature of the present invention relates to the addition of the above described mount appendages which enables the structure to be attached to an external case or housing, and with respect to the accelerometer embodiment also enables attachment of an additional proof mass. In this regard, if the mount structure portion were used to mount the sensing element directly to an external case housing, the mount structure would experience strains due to clamping forces, differential thermal expansion effects, etc. These strains would distort the structure and the vibrating beam would experience erroneous axial forces. Locating the clamping or other mounting means on the mount structure appendage does not cause such errors because the appendage is not located in a region where such strains would cause vibrating beam error forces. The same is true with respect to the attachment of an additional proof mass to the proof mass appendage.

Another feature of the present invention for the pressure transducer application is the inclusion of a stress isolation slot so that stresses and resultant strains as a result of mounting are isolated from the sensing portion of the structure.

An additional feature of the present invention with respect to a pressure transducer embodiment is a provision of a mount structure and a pressure transmission structure which are pivotally mounted to each other by at least one flexure beam for flexing about the Z axis in the direction of pressure application. The vibrating beam including isolator masses and isolator beams may be oriented between the force transmission structure and the mount structure so as to sense flexing of one relative to the other about the at least one flexure beam intersection point.

In a preferred embodiment, the force transmission structure includes a lever arm and a balance weight and at least two flexure beams to connect the force transmission structure to the mount structure at an intersection point. In a preferred embodiment, the mass of the balance weight is substantially equal to the mass of the lever arm and bellows and vibrating beam associated with the lever arm so as to offset any X axis or Y axis accelerations which would otherwise affect the measurement of force applied to the lever arm by the pressure bellows.

It will be appreciated that various alternatives to the above described configuration are within the scope of the invention. For example, while in one presently preferred accelerometer embodiment three parallel flexure beams are utilized, it will be understood that any number of flexure beams greater than two may be utilized. Specifically the number and geometry of the flexure beams depends on the ratio of X axis compliance to Z axis stiffness required and also on anticipated stress levels.

For the accelerometer application, it will also be understood that the use of the above described appendages may be reversed, i.e., the external mount appendage can be used for mounting the proof mass or the pressure transmission and the proof mass appendage can be used for the external mounting.

In the above described accelerometer embodiment, the proof mass structure extends only to the lower end of the inner structure, whereas the mounting structure extends the full height of the device. In another exemplary embodiment of the invention, however, the proof mass structure may be extended to the full height of the device, and one or more flexure beams added to the top part of the structure. As a result of this configuration, the rather fragile inner structure is further protected during handling by being more fully surrounded by the relatively thick and rugged outer structure. In addition, the added flexure beam or beams at the top of the structure may provide more overall stiffness for the entire structure.

In another exemplary accelerometer embodiment, only one mounting structure appendage is required since sufficient proof mass is provided by the resonator structure per se. In this embodiment, a pair of vertically spaced flexure beams are provided in the lower portion of the structure.

In its broader aspects, the present invention provides a monolithic resonator for a vibrating beam device either accelerometer or pressure transducer which comprises an outer structure including a mounting structure, a proof mass or pressure transmission structure, a plurality of flexure beams parallel for the accelerometer and perpendicular of the pressure transducer, extending between the mounting and either proof mass or pressure force structures; and an inner structure including first and second isolator masses, first and second isolator beams connected to one portion of the isolator masses, respectively, and a vibrating beam extending between other portions of the isolator masses; wherein the outer structure has a thickness greater than said inner structure.

Objects and advantages of this invention in addition to those noted above will become apparent from the detailed description which follows.

DETAILED DESCRIPTION OF THE INVENTION

Figure 1:
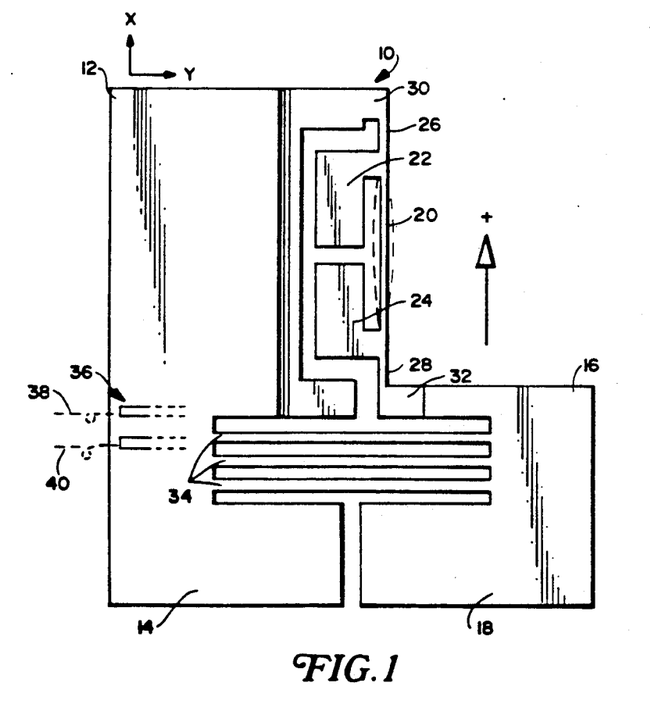
FIG. 1 is a front elevational view of one exemplary embodiment of a monolithic resonator for a vibrating beam accelerometer in accordance with the invention.
Figure 2:
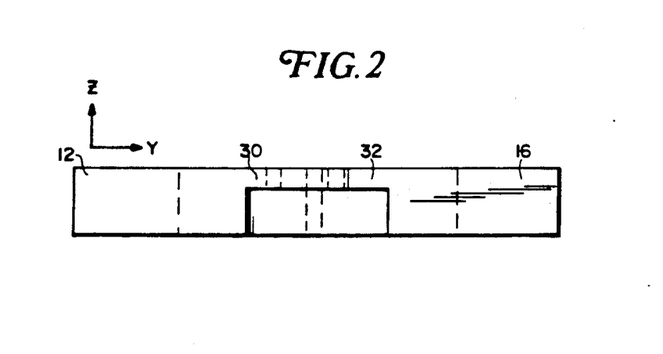
FIG. 2 is a top view of the resonator illustrated in FIG. 1.
Figure 3:
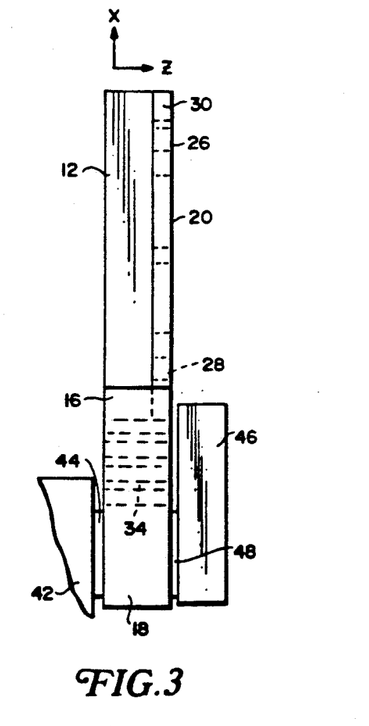
FIG. 3 is a side view of the resonator illustrated in FIG. 1.

An embodiment of the present invention as applied to vibrating beam accelerometers is shown in FIGS. 1-3.

A monolithic sensory element 10 of piezoelectric material includes a mounting structure appendage 14, an acceleration force transfer structure comprising a proof mass structure 16 and a proof mass mounting appendage 18. A vibrating beam 20 includes a pair of isolator masses 22, 24 which, in turn, are connected via isolator beams 26, 28 respectively, to surfaces 30, 32. At least one and preferably a plurality of flexure beams 34., extend horizontally between the mounting structure 12 and proof mass structure 16, relative to the vertical orientation of the vibrating beam 20.

A conventional electrode termination shown partially at 36 is provided from which leads 38, 40 extend to a conventional oscillator circuit (not shown). The beam plated electrode pattern and plated conductive paths from the vibrating beam 20 to the electrode termination 36 are also not shown since they can be any one of several piezoelectric drive patterns well known in the crystal oscillator art.

The mounting structure 12, as noted above, includes a mounting appendage 14 for mounting the unit to an accelerometer housing (not shown in FIG. 1), for example, while the proof mass mounting appendage 18 may be employed to mount additional proof mass elements (not shown in FIG. 1) in order to increase the total mass and acceleration sensitivity of the structure.

With reference particularly to FIG. 2, it may be seen that the inner structure of element 10, including the vibrating beam 20, isolator masses 22, 24, isolator beams 26, 28 and surfaces 30, 32 are significantly thinner, e.g., about ⅓ to 1/10 the thickness, in the Z-axis direction, of the outer structure.

FIG. 3 illustrates an external mount 42, such as an accelerometer housing, connected at 44 to the external mount appendage 14, and an additional proof mass 46 connected at 48 to the proof mass mount appendage 18.

In use, the structure of FIG. 1 is mounted within an accelerometer housing by means of the external mounting appendage 14. Also, as already noted, an additional mass 46 may be added to the structure at the proof mass mounting appendage 18 to increase acceleration sensitivity. It has been discovered, however, that the vibrating beam 20 may be made sufficiently thin, i.e., sufficiently sensitive to acceleration, relative to the thicker outer structure, that additional external proof masses are not necessary.

Upon sensing acceleration along the sensing axis X, the proof mass structure 16 tries to deflect relative to the mount structure 12 in the X direction as would be permitted by the compliant flexure beams 34. However, this relative deflection is restrained by the axially stiff vibrating beam 20 so that the vibrating beam will experience either tension or compression depending on the sense of the input acceleration. Since the vibration frequency of the vibrating beam 20 is sensitive to axial force, this frequency will change in proportion to the magnitude and direction of the input acceleration. The frequency change from a known zero load bias frequency is therefore a measure of input acceleration.

It will be appreciated that variations from the device illustrated in FIG. 1 are possible which nevertheless remain within the scope of the invention. For example, while FIG. 1 shows three flexure beams 34, it is understood that any number above two (the minimum number required to achieve parallel action) or more can be used. The number and geometry of the flexure beams depends on the ratio of X axis compliance to Z axis stiffness required, and also on anticipated stress levels.

It is also contemplated that the uses of the appendages may be reversed. That is, the external mounting appendage 14 can be used for mounting the proof mass 46 and the proof mass mounting appendage 18 can be used for the external mounting 42. In this arrangement, a positive input acceleration (as indicated in FIG. 1) will cause the vibrating beam to experience compression rather than tension. Moreover, the plated conductive paths which connect the vibrating beam electrodes to the lead termination area 36 will be rearranged so that the lead termination area appears on the "proof mass" structure 16 of FIG. 1. Having the same physical structure plated and mounted each way allows the resonators to be used in pairs so that an input acceleration will cause one vibrating beam to experience tension while the other is experiencing compression. The instrument output is then taken as the difference frequency. Frequency differencing has many performance advantages which include common mode rejection of nonlinearity and thermal errors. The performance advantages of this "dual beam," arrangement are fully explained in U.S. Pat. No. 4,804,875.

Figure 4:
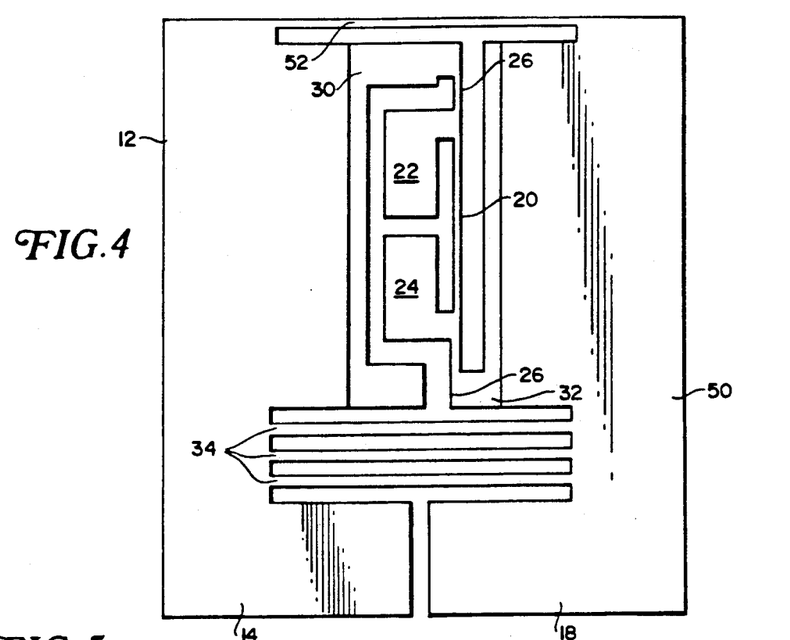
FIG. 4 is a front elevational view of a second exemplary embodiment of the invention.

Another alternative method of construction is illustrated in FIG. 4 in which like reference numerals are used to designate like elements. In this alternative embodiment, a proof mass structure 50 is extended upwardly to a point level with the mount structure 12, and another flexure beam 52 is added to the top part of the structure between the proof mass 50 and mount structure 12. It will be appreciated that more than one additional flexure beam 52 may be employed. Advantages gained by this alternative design include additional protection of the rather fragile inner structure during handling, as a result of being more fully surrounded by the relatively thick and rugged outer structure, and increased overall stiffness.

Figure 5:
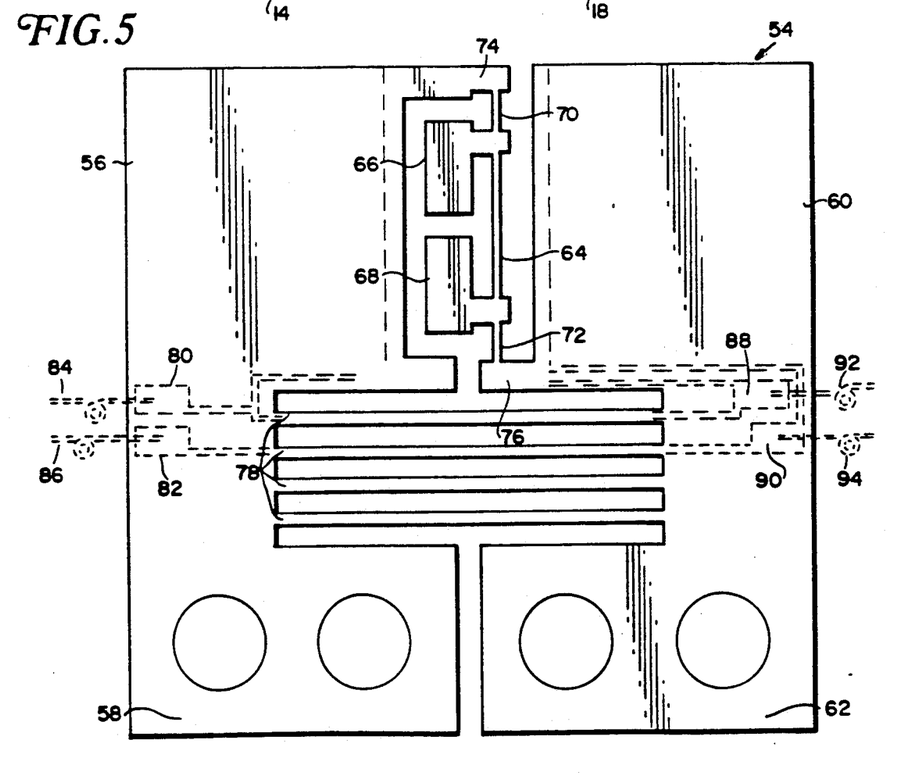
FIG. 5 is a front elevational view of a third exemplary embodiment of the invention.

Turning to FIG. 5, another embodiment of the invention is illustrated. The accelerometer 54 is provided with a mount structure 56 including an external mounting appendage 58, and a proof mass structure 60 including an external mounting appendage 62. A vibrating beam 64 extends between a pair of isolator beams 70, 72, respectively, to surfaces 74, 76. A plurality of flexure beams 78 extend between the mounting structure 56 and proof mass structure 60, respectively, in a direction substantially perpendicular to the orientation of the vibrating beam 64.

In this embodiment, the accelerometer element may be mounted in either of two configurations. In order to accommodate this alternative mounting, optional electrode termination areas (shown in phantom) are also provided in the electrode plating pattern.

In one mounting, electrode terminations 80, 82 are provided, with associated leads 84, 86 extending to the oscillator circuit (not shown). In the other, electrode terminations 88, 90 are provided with associated leads 92, 94. This arrangement permits a single resonator structure and single plating pattern to be used as either a tension or compression resonator, depending on how the element is mounted.

Figure 6:
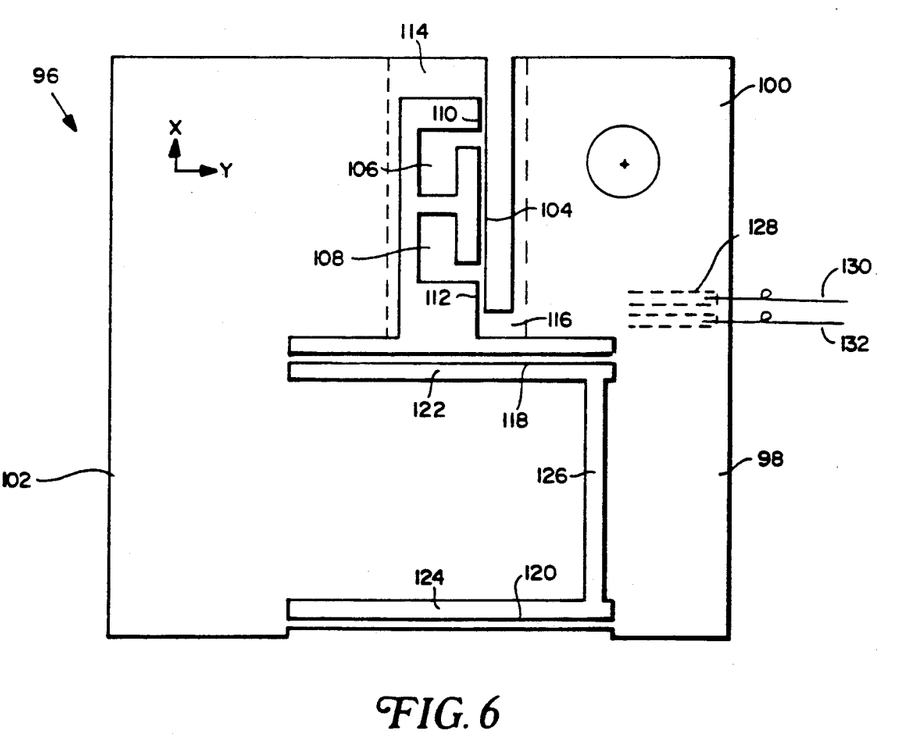
FIG. 6 is a front elevational view of a fourth exemplary embodiment of the invention.
Figure 7:
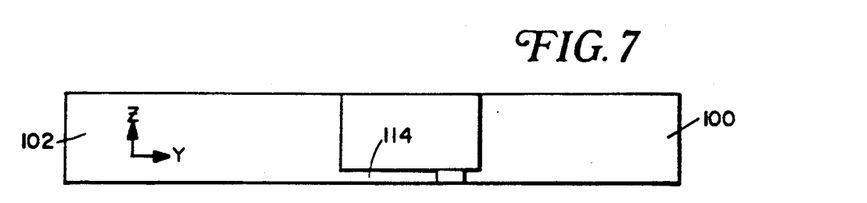
FIG. 7 is a top view of the resonator illustrated in FIG. 6.

Still another exemplary embodiment of the invention is illustrated in FIGS. 6 and 7. The resonator 96 includes a mounting structure 98, a mounting structure appendage 100, and a proof mass structure 102. A vibrating beam 104 extends between a pair of isolator masses 106, 108 which, in turn, are connected via isolator beams 110, 112, respectively, to surfaces 114, 116. Flexure beams 118, 120 extend horizontally between the mounting structure 98 and the proof mass structure 102. Space 122 below the upper beam 118 is connected to space 124 above the lower beam 120 by a vertically extending slot or space 126.

A conventional electrode termination shown in phantom at 128 is provided from which leads 130, 132 extend to a conventional oscillator circuit (not shown).

As in the previously described embodiments, the inner structure including vibrating beam 104, isolator masses 106, 108, isolator beams 110, 112 and surfaces 114, 116 are significantly thinner in the Z-axis direction than the outer structure including the mounting structure 98, mounting structure appendage 100, proof mass structure 102 and flexure beams 118, 120.

This exemplary embodiment of the invention is of simpler design than the previously described embodiments in that only a single mounting appendage 100 is required. This is because the thinness and sensitivity of the inner structure results in the proof mass 102 being sufficient, i.e., there is no need for a second mounting appendage for attaching a supplemental proof mass. This is particularly true for dual-beam, push/pull applications, where one resonator 96 will be mounted upside down relative to another identical resonator.

In addition, the resonator 96 illustrated in FIGS. 6 and 7 requires only a single flexure beam 118, 120 at each of two, vertically spaced locations. By thus separating the flexure beams, the angular stiffness of the proof mass suspension is increased relative to moments about the Y-axis. In the event an even stiffer resonator structure is required, multiple flexure beams can be located at one or both of the upper and lower, vertically separated locations.

Figure 8A:
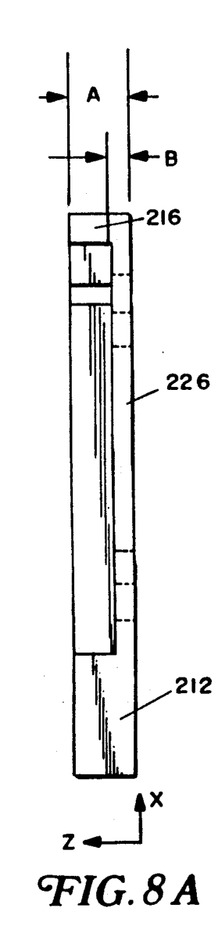
FIGS. 8a, 8b and 8c are side, front elevational and partial front elevational views, respectively, of the resonator for a vibrating beam pressure transducer in accordance with the present invention.
Figure 8B:
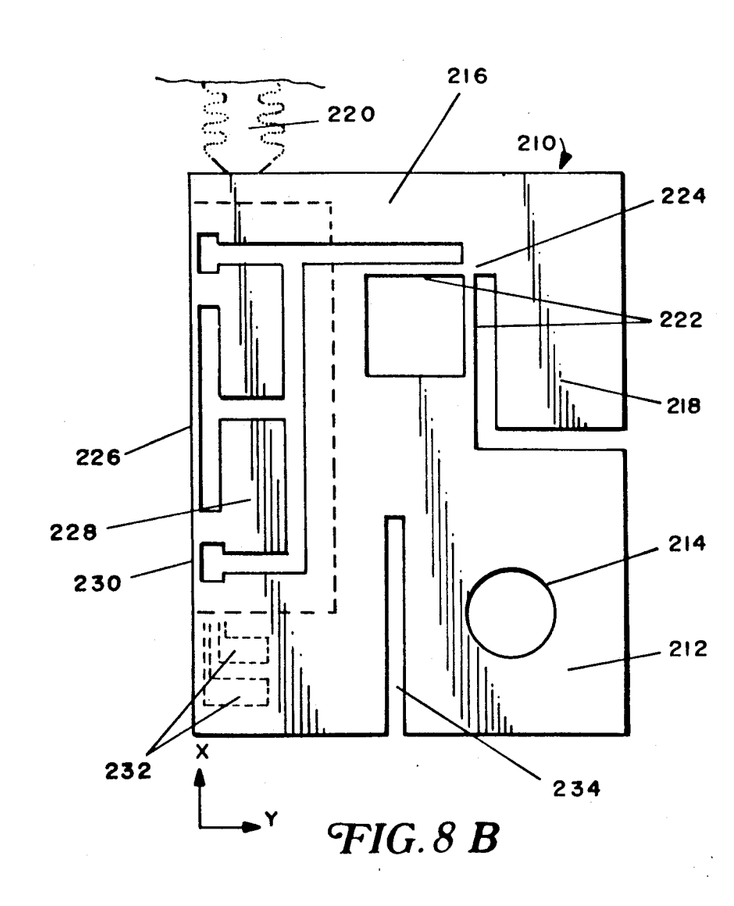
Figure 8C:
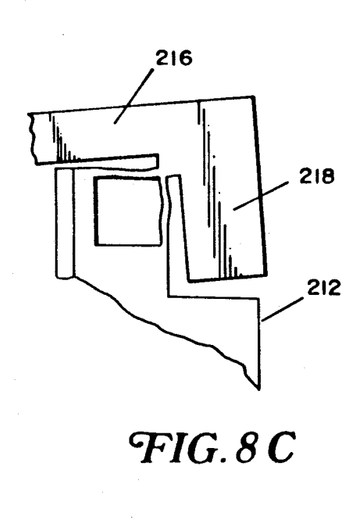

An embodiment of the present invention as applied to vibrating beam pressure transducers is shown in FIGS. 8a, 8b and 8c.

The monolithic sensory element 210 includes a mount structure 212 with mount hole 214. The force transfer structure comprises a lever arm structure including lever arm 216 and balance weight 218. In the pressure transducer embodiment, a force transfer structure comprising a means for converting fluid pressure, bellows 220 (shown in dotted line form), provides a force to act upon lever arm 216 by virtue of a fluid (liquid or gas) pressure difference between fluid inside and outside of said bellows.

The force transfer structure is connected to the mount by at least one flexure beam which, in a preferred embodiment, comprises two flexure beams 222. In a further preferred embodiment, the flexure beams are orthogonally connected between the mount structure and the force transfer structure so as to oppose relative movement between the force transfer structure and the mount structure in X and Y directions while permitting pivotal movement between the structures about an axis parallel to the Z axis at the pivot point 224. Relative movement about pivot point 224 of the force transfer structure relative to the mount structure is resisted by the vibrating beam structure which extends between the force transfer structure and the mount structure. FIG. 8c illustrates the pivoting of the force transfer structure comprising lever arm 216 and balance weight 218 relative to the mount 212 about the pivot point 224.

The vibrating beam structure includes vibrating beam 226, isolator mass 228 and isolator beam 230. The operation of the vibrating beam, isolator mass and isolator beams have previously been discussed in prior art references. As previously noted, electrode terminations 232 provide an electronic connection to the oscillator to maintain the beam in vibration. An optional mounting stress isolation slot 234 serves to further isolate the vibrating beam from stresses related to compression or tension in the vicinity of the mount structure 212 or the mount hole 214.

As in the case of the vibrating beam accelerometer, the thickness (in the Z axis direction) of the inner structure, comprising vibrating beam 226, isolator mass 228 and isolator beams 230, is less than the thickness of the mount, flexure beams and force transfer structure. This provides sufficient ruggedness and rigidity of the device while still permitting a high degree of sensitivity, and accuracy. This difference in thickness is illustrated by the rectangular dashed outline surrounding the vibrating beam, isolator masses and isolator beams in FIG. 8b. The difference in thickness in this area is illustrated in FIG. 8a where the outer structure thickness A is substantially greater than the inner structure thickness B.

Operation of the pressure transducer embodiment is similar to that of the accelerometer embodiment except that the force transfer structure is a lever arm and balance weight assembly moved under the influence of a fluid pressure difference between the inside and outside of bellows 220 instead of a proof mass which provides a force under the influence of acceleration.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A monolithic resonator for a force sensor, wherein said force sensor includes a vibrating beam, said resonator comprising:
   an outer structure including a mounting structure, a force transfer structure, and at least one flexure beam extending between said mounting and force transfer structures; and
   an inner structure including said vibrating beam extending between said force transfer structure and said mounting structure;
   wherein said outer structure has a thickness greater than said inner structure.

2. A monolithic resonator according to claim 1 wherein said outer structure thickness is about three to about ten times the thickness of said inner structure.

3. A monolithic resonator according to claim 1, wherein said inner and outer structures lie within a common plane along one face of the resonator, and said inner and outer structure lie, respectively, within a pair of parallel planes along another face.

4. A monolithic resonator according to claim 3, wherein the resonator has a height extending in an X direction, a length extending in a Y direction, and a thickness extending in a Z direction, said X, Y, and Z directions being substantially mutually perpendicular.

5. A monolithic resonator according to claim 4, wherein said parallel planes extend in the X-Y directions.

6. A monolithic resonator according to claim 1 and further including a mounting structure appendage for attaching said resonator to an accelerometer housing.

7. A monolithic resonator according to claim 1 and further including a structure appendage for attaching a force input structure to said force transfer structure.

8. A monolithic resonator according to claim 1, wherein said at least one flexure beam is located in proximity to one end of said vibrating beam and extend substantially perpendicular thereto.

9. A monolithic resonator according to claim 1, wherein said vibrating beam extends longitudinally in the X-direction.

10. A monolithic resonator according to claim 4 wherein said force transfer structure comprises a proof mass structure and said proof mass structure extends in the X-direction less than about one half an extent in the X-direction of said mounting mass structure.

11. A monolithic resonator according to claim 8, wherein said at least one flexure beam comprises three flexure beams for load stiffness in the Z-direction and load sensitivity in the X-direction.

12. A monolithic resonator according to claim 4, wherein said mounting structures and said force transfer structure extend substantially equally in the X-direction, and wherein said at least one flexure beam is located in proximity to one end of said vibrating beam.

13. A monolithic resonator according to claim 12, wherein at least one additional flexure beam is provided between said mounting and force transfer structure in proximity to the other end of said beam.

14. A monolithic resonator as defined in claim 12 wherein alternative electrode terminations are provided on both said mounting structure and said force transfer structure.

15. A monolithic resonator as defined in claim 1 wherein alternative electrode terminations are provided on both said mounting structure and said force transfer structure.

16. A monolithic resonator as defined in claim 8 wherein said at least one flexure beam comprises a pair of vertically spaced beams.

17. A monolithic resonator comprising:
a vibrating beam;
unitary isolator mass means at either end of said beam;
isolator beams extending from each of said isolator mass means;
a mounting structure to one side of said beam, and a force transfer structure to the other side of said beam; and
at least one flexure beam extending between said mounting structure and said force transfer structure, below said vibrating beam and substantially perpendicular thereto.

18. A monolithic resonator as defined in claim 17 and further comprising at least one additional flexure beam extending between said mounting structure and said force transfer structure above said vibrating beam and substantially parallel to said flexure beams.

19. A monolithic resonator according to claim 17 and further including alternative external mount appendages and alternative electrode terminations for selective attachment of leads, the choice of termination determined by the use of the resonator as a tension or compression resonator.

20. The monolithic resonator as defined in claim 17 wherein the vibrating beam, isolator mass means and isolator beams have a first thickness, and the mounting and force transfer structures have a second thickness, said second thickness greater than said first thickness.

21. A monolithic resonator as defined in claim wherein the first thickness is within the range of from $\frac{1}{3}$ to 1/10 said second thickness.

22. A monolithic resonator as defined in claim wherein said force transfer and mounting structures have substantially identical height dimensions.

23. A monolithic resonator comprising:
a vibrating beam;
unitary isolator mass means at either end of said beam;
isolator beams extending from each of said isolator mass means;
a mounting structure to one side of said vibrating beam, and a force transfer structure to the other side of said vibrating beam; and
at least one flexure beam extending between said mounting structure and said force transfer structure, below said vibrating beam and substantially perpendicular thereto;
wherein said vibrating beam, said isolator mass means and said isolator beams have thicknesses within the range of from $\frac{1}{3}$ to 1/10 thicknesses of at least said mounting structure and said force transfer structure.

24. A monolithic resonator for a vibrating beam pressure transducer comprising:
an outer structure including a mounting structure, a lever arm structure and at least one flexure beam connecting said lever arm structure to said mount structure at a pivot point; and
an inner structure including a vibrating beam structure extending between said lever arm structure and said mounting structure;
means for converting fluid pressure to a force on said lever arm structure in a direction other than toward said pivot point; and
wherein said outer structure has a thickness greater than said inner structure.

25. A monolithic resonator according to claim 24 wherein said outer structure thickness is about three to about ten times the thickness of said inner structure.

26. A monolithic resonator according to claim 24, wherein said inner and outer structures lie within a common plane along one face of the resonator, and said inner and outer structure lie, respectively, within a pair of parallel planes along another face.

27. A monolithic resonator according to claim 26, wherein the resonator has a height extending in an X direction, a length extending in a Y direction, and a thickness extending in a Z direction, said X, Y, and Z directions being substantially mutually perpendicular.

28. A monolithic resonator according to claim 27, wherein said parallel planes extend in the X-Y directions.

29. A monolithic resonator according to claim 24 and further including an external mount appendage for attaching said resonator to a pressure transducer housing.

30. A monolithic resonator according to claim 24 wherein said means for converting fluid pressure comprises a bellows.

31. A monolithic resonator according to claim 24, wherein said at least one flexure beam comprises at least two flexure beams orthogonally oriented at said pivot point.

32. A monolithic resonator according to claim 24, wherein said vibrating beam structure extends longitudinally in the X-direction.

33. A monolithic resonator according to claim 27 wherein said lever arm structure includes a lever arm and a balance weight, said lever arm and said balance weight substantially equally balanced in the x and y directions about said pivot point.

34. A monolithic resonator comprising:
a vibrating beam;
unitary isolator mass means at either end of said beam;
isolator beams extending from each of said isolator mass means;
a mounting structure to one side of said beam, and a lever arm structure to the other side of said beam; and
at least one flexure beam extending between said mounting structure and said lever arm structure, below said lever arm and substantially parallel to said vibrating beam.

35. A monolithic resonator as defined in claim 34 and further comprising at least one additional flexure beam extending between said mounting structure and said lever arm structure adjacent said vibrating beam and substantially perpendicular thereto.

36. The monolithic resonator as defined in claim 34 wherein the vibrating beam, isolator mass means and isolator beams have a first thickness, and the mounting and lever arm structures have a second thickness, said second thickness is greater than said first thickness.

37. A monolithic resonator as defined in claim 36 wherein the first thickness is within the range of from $\frac{1}{3}$ to 1/10 the second thickness.

38. A monolithic resonator comprising:
a vibrating beam;
unitary isolator mass means at either end of said beam;
isolator beams extending from each of said isolator mass means;

a mounting structure to one side of said beam, and a lever arm structure to the other side of said beam; and at least one flexure beam extending between said mounting structure and said lever arm structure; substantially parallel to said vibrating beam;

wherein said vibrating beam, said isolator mass means and said isolator beams have thicknesses within the range of from ⅓ to 1/10 thicknesses of said mounting structure and said lever arm structure.

* * * * *